United States Patent [19]

Kelly

[11] Patent Number: 5,034,745
[45] Date of Patent: Jul. 23, 1991

[54] DATA ACQUISITION WITH VERNIER CONTROL

[75] Inventor: John H. Kelly, Phoenix, Ariz.

[73] Assignee: BCT Spectrum Inc., Phoenix, Ariz.

[21] Appl. No.: 901,905

[22] Filed: Aug. 29, 1986

[51] Int. Cl.$^5$ ............................................. H03M 1/12
[52] U.S. Cl. .................................................. 341/155
[58] Field of Search .... 340/347 AD, 347 M, 347 CC, 340/347 NT; 324/99 D; 341/155

[56] References Cited

U.S. PATENT DOCUMENTS 4,485,372 11/1984 Holloway .................... 340/347 AD
4,571,574 2/1986 Krynicki ................. 340/347 DA X

OTHER PUBLICATIONS

The Engineering Staff of Analog Devices, Inc., Analog-Digital Conversion Handbook, 6/1972, pp. I-34, I-35 I-52 to I-57.
The Engineering Staff of Digital Equipment Corp., Analog-Digital Conversion Handbook, 1964, pp. 20-22.

*Primary Examiner*—William M. Shoop, Jr.
*Assistant Examiner*—Brian Young
*Attorney, Agent, or Firm*—Cahill, Sutton & Thomas

[57] ABSTRACT

Analog data is collected by conversion to a digital representation thereof via an analog to digital converter. Reference voltages for the converter are provided by digital to analog converters. The reference voltages are varied under the control of a central processing unit to establish a range of interest in the analog data. The range of interest is narrower than the conversion range of the analog to digital converter.

4 Claims, 1 Drawing Sheet

DATA ACQUISITION WITH VERNIER CONTROL

BACKGROUND OF THE INVENTION

This invention relates to data acquisition and, in particular, to analog to digital conversion of an electrical signal.

As known in the art, transducers are used in a host of applications to convert the effect of some phenomenon into an electrical signal. The pervasiveness of the digital computer requires that the signal be in digital form for storage, analysis, or other manipulation. Since many transducers produce analog signals, these must be converted to digital form. In this conversion, some information is inevitably lost.

For example, if a transducer produces an output signal which varies smoothly from zero to five volts, converting the signal to digital form introduces discontinuities or steps in the signal in which information is lost. It is therefore desirable to obtain as small a step as possible. A problem with this goal is the fact that size of the step is directly related to the number of bits used to quantify the information. If a converter had a resolution of eight bits, then the five volt range could be divided into two hundred fifty-six discrete steps, each step spanning approximately twenty millivolts. If the converter had a resolution of twelve bits, the five volt range could be divided into four thousand ninety-six steps of about one millivolt each.

The greater resolution appears highly desirable until one starts to consider the time it takes to manipulate the data or the storage requirements for the data. One is then faced with the problem of trying to resolve apparently contradictory requirements of high speed and high resolution.

It should be noted that, as used herein, "resolution" and "accuracy" are distinct concepts. One may divide an interval into any number of steps but this says nothing of how well the conversation relates to the input signal. The former relates to resolution, the latter to accuracy. In implementing the present invention, currently available hardware is sufficiently accurate.

In view of the foregoing, it is therefore an object of the present invention to increase the apparent resolution of an analog to digital (A/D) converter.

Another object of the present invention is to provide a means for monitoring selected portions of a process.

A further object of the present invention is to provide high speed, high resolution A/D conversion.

Another object of the present invention is to provide a means capable of adapting itself to the observed data.

A further object of the present invention is to provide adaptive window means for acquiring or monitoring data.

Another object of the present invention is to provide an A/D converter having vernier resolution.

SUMMARY OF THE INVENTION

The foregoing objects are achieved in the present invention wherein an A/D converter has first and second digital to analog (D/A) converters connected to the high and low reference voltage inputs thereof, respectively. The output of the A/D converter is connected to a central processing unit (CPU) over a suitable bus. The CPU is connected to and controls the D/A converters, e.g. directly, via suitable bus drivers, or via input/output (I/O) port devices. The CPU establishes the size of the conversion range by setting the reference low voltage and reference high voltage to less than the maximum size possible with the given A/D converter. Thus a smaller interval is divided the same number of times, increasing the apparent resolution but not the number of bits of data. Thus, the speed of the system is not sacrificed.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
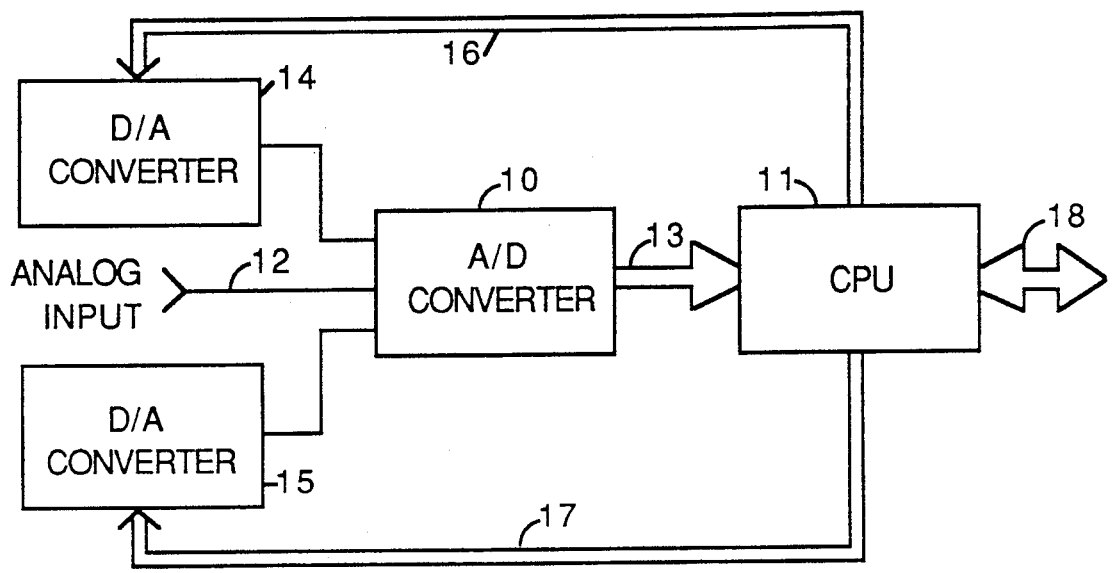
FIG. 1 illustrates a preferred embodiment of the present invention.

FIG. 1 illustrates an A/D converter in accordance with the present invention wherein A/D converter 10 has its output connected to CPU 11 and input 12 connected to a suitable source of analog signal. The A/D converter in accordance with the present invention can be used in any environment in which a transducer is available for converting some effect into a variable voltage. Converter 10 has two reference inputs, one for receiving a reference low voltage the other for receiving a reference high voltage. These voltages are provided by D/A converter 14 and D/A converter 15 respectively. Converter 10 and CPU 11 are interconnected by a suitable bus 13, typically a parallel bus. Similarly, CPU 11 and converters 14 and 15 are interconnected by buses 16 and 17 respectively. CPU 11 also comprises a suitable output bus 18 for interfacing with other devices, e.g. for the control of a process being monitored. It is understood by those of skill in the art that buses 13, 16, 17, and 18 may comprise but a single bus, depending upon the particular implementation of the present invention.

In operation, CPU 11 sends to converters 14 and 15 data representative of the reference high and reference low voltages to be applied to converter 10. The voltages define a vernier range the size of which is divided into a number of steps or intervals, depending upon the resolution of converter 10. By virtue of programmable converters 14 and 15, one can establish that vernier range anywhere within the range of converter 10.

Figure 2:
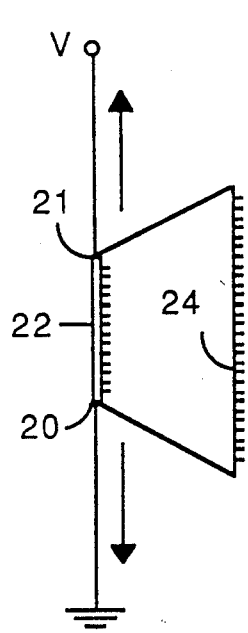
FIG. 2 illustrates the operation of the present invention.

FIG. 2 is useful in understanding the operation of the present invention. In FIG. 2, reference low voltage 20 and reference high voltage 21 establish range 22 within the range illustrated in FIG. 2 as extending between ground potential and some positive voltage $\underline{V}$. If one considers $\underline{V}$ as representing the maximum voltage which can be applied as an input to converter 10, one can visualize this range as being divisible into a particular number of steps or intervals. However, by moving reference low voltage up to the voltage represented at position 20 and moving reference high voltage down to the voltage represented at position 21, one narrows the voltage range to be divided into that same number of steps or intervals as illustrated by vernier range 24. Thus one has increased the apparent resolution of converter 10 and yet obtained that increase in resolution without increasing the number of bits.

A numerical example will further illustrate the present invention. If converter 10 has a useful range of 0-5 volts DC, and comprises an eight-bit A/D converter, that voltage range can be divided into two hundred fifty-six steps each comprising approximately 20 millivolts. On the other hand, if the voltage range is reduced from 0-5 volts to, for example, 1.5-2.5 volts, then each step comprises approximately 4 millivolts. Thus the apparent resolution is increased approximately five fold.

The benefits obtainable from the present invention depend, in part, upon the minimum voltage resolution of the particular hardware used to implement the present invention. For example, a preferred embodiment of the present invention has been implemented utilizing a 68HC11 microcomputer, as sold by Motorola, Inc. This chip comprises an eight-bit A/D converter and CPU within a single package. Thus blocks 10 and 11 as illustrated in FIG. 1 are contained within a single integrated circuit. The A/D converter portion of this circuit has a minimum voltage resolution of approximately 1 millivolt. Thus the minimum vernier range for implementating the present invention utilizing this particular integrated circuit is 256 millivolts. This vernier range is considerably smaller than the voltage rating of the A/D converter, which is five volts. Thus one can obtain approximately a 19× improvement in apparent resolution in accordance with the present invention. Stated another way, with this particular implementation of the present invention, one obtains what appears to be twelve bit resolution from an eight-bit device. Thus, one increases the apparent resolution without decreasing the speed with which the data can be handled.

The accuracy of the present invention depends both on the accuracy of the reference voltages and the linearity of the converter. The resolution of the D/A converters should at least equal the resolution of A/D converter 10. In a preferred embodiment of the present invention, the resolution of D/A converters 14 and 15 is typically twelve bits, while the resolution of A/D converter 10 is typically eight bits. Thus one maintains accuracy while improving resolution.

Figure 3:
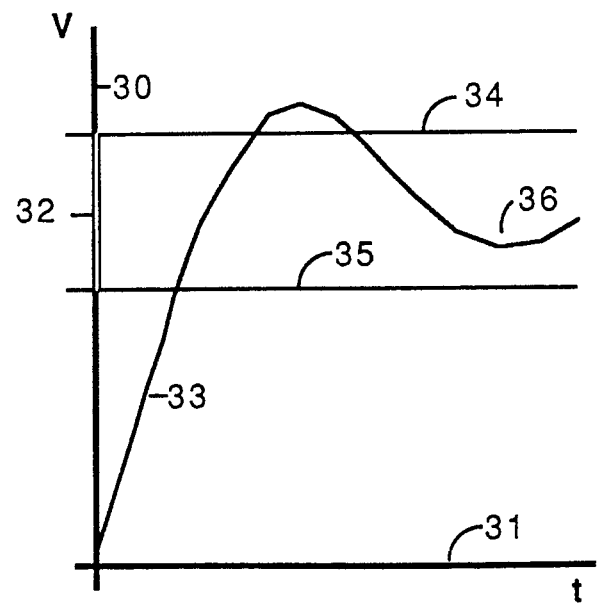
FIG. 3 is an example of data to be monitored.

FIG. 3 illustrates an example of a use of the present invention wherein, regardless of accuracy, one wishes to monitor a particular portion of a signal, e.g. representative of a particular point in a process. In this example, it is assumed that one must detect minimum 36 on curve 33. Thus is it clear that window 22 need not comprise the entire range from 0-V volts. In this case, the range is reduced to interval 32 as illustrated in FIG. 3. CPU 11 is easily programmed, as well known to those of ordinary skill in the art, to monitor the output from converter 10 to detect any or all of magnitude, slope, maximum, and minimum. In this particular case, CPU 11 need only detect minimum 36, which is interpreted as an endpoint for the process. By improving the apparent resolution, one obtains a more accurate indication of when the minimum takes place and can therefore more accurately control the endpoint of the process.

Alternately, since CPU 11 is programmable for any desired function, one can easily make the system in accordance with the present invention adaptive to the incoming data by initially having a vernier range which covers the entire range of converter 10, monitoring the data to determine in what range the data primarily falls, and then establishing reference high and low voltages so that the vernier range encompasses only that portion and ignores other data. Thus one obtains, in effect, the self-calibrating system or a system which adapts itself to incoming data so that only relevant data is monitored. If need be, CPU 11 can also be programmed to move the vernier range in response to shifts in the data. Thus, one obtains from the system an indication of average or moving average of the incoming data. Vernier range 32 can be moved by changing the size thereof, i.e. reference voltage points 20 and 21 are moved relative to each other e.g. by moving point 21, or by changing its location, i.e points 20 and 21 are moved together. Alternatively, vernier range 32 can be placed where the least data, but the data of most interest, is expected. One can thereby significantly reduce the amount of data to be stored or further processed.

There is thus provided by the present invention a relatively simple system in which apparent resolution is increased without any penalty in the speed with which data can be handled. Further, one obtains a dynamic data acquisition system since the conversion system in accordance with the present invention is easily adapted to the incoming data.

Having thus described the present invention it should be apparent to those of ordinary skill in the art that modifications can be made within the spirit and scope of the present invention. For example, while noted as implemented on a 68HC11 microcomputer, this is not the only implementation which can be made of the present invention. Any CPU can be used for CPU 11 and any suitable D/A and A/D converter can be used. Further, the indication of a particular number of bits is by way of example only and should not be construed as limiting. The benefits of the present invention are obtainable whether CPU 11 is a four, eight, sixteen, or thirty-two bit CPU, and whether converters 10, 14 and 15 are eight, ten, twelve, fourteen, etc. bit devices.

I claim:

1. Apparatus for converting an analog electrical signal into a digital signal comprising:

A/D conversion means having n-bit resolution, wherein n is the number of binary digits in said digital signal, said A/D conversion means having first and second reference voltage inputs and a signal input for receiving said analog electrical signal, said A/D conversion means having a maximum input range of X;

first and second D/A conversion means having the outputs thereof connected to respective reference inputs of said A/D conversion means;

control means connected to the inputs of said D/A conversion means for supplying respective first and second digital control signals representative of an operating range for said A/D conversion means less than X, whereby the apparent resolution of said A/D conversion means is increased without increasing the number of bits in said digital signal or the length of time for the conversion to take place;

wherein the output of said A/D conversion means is connected to an input of said control means and said control means changes said first and second digital control signals in response to the digital signal to change the size of the operating range.

2. Apparatus for converting an analog electrical signal into a digital signal comprising:

A/D conversion means having n-bit resolution, wherein n is the number of binary digits in said digital signal, said A/D conversion means having first and second reference voltage inputs and a signal input for receiving said analog electrical signal, said A/D conversion means having a maximum input range of X;

first and second D/A conversion means having the outputs thereof connected to respective reference inputs of said A/D conversion means;

control means connected to the inputs of said D/A conversion means for supplying respective first and second digital control signals representative of an operating range for said A/D conversion means less than X, whereby the apparent resolution of said A/D conversion means is increased without increasing the number of bits in said digital signal or the length of time for the conversion to take place;

wherein the output of said A/D conversion means is connected to an input of said control means and said control means changes said first and second digital control signals in response to the digital signal to change the size of the operating range.

3. The apparatus as set forth in claim 1 wherein said control means changes said first and second digital control signals in response to the digital signal to change the size and the location of said operating range.

4. A method for converting an analog electrical signal into a digital output signal comprising the steps of:

providing first and second D/A converters having m-bit resolution for generating first and second reference voltages, respectively;

providing an A/D converter having a first, predetermined conversion range and n-bit resolution, wherein n is an integer less than m;

supplying first and second digital control signals to said D/A converters, wherein said digital control signals are dependent upon the value of said digital output signal;

supplying the resulting first and second reference voltages to said A/D converter to operate said converter in a second conversion range, narrower than said first range; and applying an input signal to said A/D converter.

* * * * *